United States Patent
Vulpio

(10) Patent No.: US 7,335,584 B2
(45) Date of Patent: Feb. 26, 2008

(54) METHOD OF USING SACVD DEPOSITION AND CORRESPONDING DEPOSITION REACTOR

(75) Inventor: Michele Vulpio, Santo Spirito (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 374 days.

(21) Appl. No.: 10/693,639

(22) Filed: Oct. 24, 2003

(65) Prior Publication Data

US 2004/0192068 A1    Sep. 30, 2004

Related U.S. Application Data

(63) Continuation-in-part of application No. 09/794,299, filed on Feb. 27, 2001, now abandoned.

(30) Foreign Application Priority Data

Feb. 29, 2000   (EP) .................................. 00830153

(51) Int. Cl.
   *H01L 21/4763*   (2006.01)
   *H01L 21/31*     (2006.01)
   *C23C 16/00*     (2006.01)

(52) U.S. Cl. ...................... 438/634; 438/642; 438/778; 257/E21.292; 118/726

(58) Field of Classification Search ................ 438/634, 438/642, 778, 77; 257/E21.292; 148/DIG. 113; 118/726
   See application file for complete search history.

(56) References Cited

U.S. PATENT DOCUMENTS 5,324,690 A  * 6/1994 Gelatos et al. .............. 438/634

5,356,477 A  * 10/1994 Visser ........................ 118/726

FOREIGN PATENT DOCUMENTS

EP   0 299 249   1/1989

OTHER PUBLICATIONS

Raupp, G. B. et al. "Conformality of SiO/ sub 2/films from tetraethoxysilane-sourced remote microwave plasma-enhanced chemical vapor deposition", Journal of Vacuum Science and Technology (Vacuum, Surfaces and Films), May-Jun. 1995 pp. 676-680, XP002143946.
European Search Report for European Patent Application No. 00830153.3. dated Jul. 31, 2001.

* cited by examiner

*Primary Examiner*—Long Pham
*Assistant Examiner*—Steven H Rao
(74) *Attorney, Agent, or Firm*—Lisa K. Jorgenson; Stephen Bongini; Fleit Kain Gibbons Gutman Bongini & Bianco, P.L.

(57) ABSTRACT

A method is provided for using SACVD deposition to deposit at least one layer of dielectric material inside a deposition reactor during the fabrication of at least one semiconductor integrated circuit. According to the method, a reaction chamber is provided for carrying out SACVD deposition, and a stream of a first reaction gas containing oxygen plasma is supplied into a gas feed conduit connected to the reaction chamber. Microwaves are applied inside the gas feed conduit in order to produce sufficient oxygen radicals from the oxygen plasma, the oxygen radicals being necessary to initiate SACVD deposition. A stream of a second reaction gas is supplied into the reaction chamber, with the second reaction gas being suitable to initiate SACVD deposition when reacting with oxygen radicals. The first reaction gas in which sufficient oxygen radicals have been produced from oxygen plasma is supplied into the reaction chamber to perform an SACVD deposition within the reaction chamber through reaction of oxygen radicals with the second reaction gas. Also provided is a deposition reactor for performing an SACVD deposition technique for fabricating a semiconductor integrated circuit.

16 Claims, 2 Drawing Sheets

METHOD OF USING SACVD DEPOSITION AND CORRESPONDING DEPOSITION REACTOR

CROSS-REFERENCE TO RELATED APPLICATIONS

This application is a continuation-in-part of prior U.S. application Ser. No. 09/794,299, filed Feb. 27, 2001, now abandoned. The entire disclosure of application Ser. No. 09/794,299 is herein incorporated by reference.

BACKGROUND OF THE INVENTION

1. Field of the Invention

The present invention relates to integrated circuits, and more specifically to a Sub-Atmospheric Chemical Vapor Deposition (SACVD) application method for fabricating semiconductor integrated circuits and a corresponding deposition reactor.

2. Description of Related Art

Providing adjacent or overlapping dielectric material layers having the same composition is fairly common in today's electronic technologies, and at various stages of manufacturing integrated circuits. In order to form two-stack layers of this kind, it is standard practice to have a first layer of dielectric material partly or fully overlapped by a second dielectric layer. However, before forming the second layer, there can be intermediate process phases leading to the formation of a sacrificial layer which is then in part or fully removed. In any event, at the end of these process phases, the second dielectric layer will have its bottom surface directly in contact with the top surface of the first dielectric layer.

Dielectric materials, such as silicon oxide or nitride, are usually used either to provide electrical isolation between conductive layers or to protect underlying integrated circuit structures from contamination. A basic aim of two-stack dielectric layers is to ensure protection in the event that one of the layers becomes damaged. Therefore, it is important that in no portion of the two-stack layer is there left a doubtful adhesion between the overlapping layers.

Nevertheless, some materials have adhesion problems at the interface. These problems may originate from inherent characteristics of the material that are not yet fully understood by the experts. For example, it is believed that because of different thicknesses of the layers, stress situations which tend to delaminate the material can occur when such strain exceeds the molecular attraction force between the layers.

Contributing factors may be the total of the processing steps undergone by the semiconductor, or different processing temperatures. In addition, proper adhesion between the overlapping layers is difficult to achieve because of certain processing methods that are customarily used during the fabrication of integrated circuits.

Conventionally, the dielectric layers (except for the first one which can be formed by thermal oxidation) are usually formed by deposition techniques such as CVD (Chemical Vapor Deposition) performed inside a reactor. The chemical precursor of the element to be deposited is reacted during the gas phase. The chemio-physical properties of the layer are controlled by such processing parameters as pressure and the concentration of reactive gases like $O_3$ and TEOS (Tetra-EthylOrtho-Silicate). However, the dielectric formed with the CVD method is often uneven through its thickness due to a sort of reactive inertia at the initial phase of the deposition. Furthermore, any residues left from previous processing phases on the surface of the first layer may interfere with the deposition and proper adhesion between the layers, especially when the dielectric materials happen to be markedly stiff (as is the case with silicon nitride and oxynitride).

Aimed at improving the adhesion between dielectric material layers, certain techniques have been developed in which the surface of the underlying layer is treated before forming the second layer. For example, a sputtering process phase of ion bombarding the surface of the first layer may be carried out to enhance adhesion of the reactants to be deposited. This is done, for example, with layers of silicon oxide deposited using TEOS as precursor.

Another viable approach is known as Sub-Atmospheric Chemical Vapor Deposition (SACVD), which consists of depositing a doped or undoped film of silicon oxide based on the combustive reaction of $O_2$ and TEOS initiated by the presence of ozone ($O_3$). Details of this technique can be found in K. Fujino et al., "Doped Silicon Oxide Deposition by Atmospheric Pressure and Low Temperature Chemical Vapor Deposition Using Tetraethoxysilane and Ozone," *Journal of the Electrochemical Society*, Vol. 138, No. 10, October 1991, Manchester, N. H., U.S.A., pp. 3019-3024, which is herein incorporated by reference.

The peculiar feature of this deposition technique is a good gap-fill and excellent step coverage, which can be achieved by optimizing the deposition parameters. It has, however, a major limitation in its low throughput of no more than 6.5 wafers/hour. Furthermore, the use of ozone ($O_3$) has several drawbacks: (1) it is a highly harmful gas; (2) the proportion of ozone is dictated by the limitations of the ozonizer power output; and (3) the TEOS flow cannot be increased to achieve a higher throughput without at the same time losing gap-fill. At process temperature, ozone undergoes almost complete dissociation already inside the reactive gas injection system (shower head) into $O_2$ and O radicals which constitute radical initiators activating the combustion process.

It is known, from literature as well as from tests carried out by the Inventor, that the gap filling rate of the dielectric film improves with increased pressure and ozone proportion, and decreased TEOS flow rate. Unfortunately, equipment throughput proceeds in the reverse direction. Accordingly, raising the flow rate of TEOS while keeping the ozone ratio unaltered (for maximum gap filling performance) appears to be the most convenient course for getting a higher process capacity. However, this ideal setting has a limitation in the ability to maximize the ozone percentage with the ozonizers currently in use. These ozonizers can supply 17% ozone at most.

SUMMARY OF THE INVENTION

In view of these drawbacks, it is an object of the present invention to overcome the above-mentioned drawbacks and to provide a method of using SACVD deposition that improves the yield in the deposition of dielectric layers while providing good step coverage.

Another object of the present invention is to provide a deposition method in which a remote oxygen ($O_2$) plasma is used to generate the oxygen radicals necessary for initiating a combustion process without using ozone. In preferred embodiments, the oxygen radicals are directly produced by a magnetron that is associated with the deposition reactor and capable of providing maximum scattering of the molecules introduced into the reaction chamber.

One embodiment of the present invention provides a method of using SACVD deposition to deposit at least one layer of dielectric material inside a deposition reactor during the fabrication of at least one semiconductor integrated circuit. According to the method, a reaction chamber is provided for carrying out SACVD deposition, and a stream of a first reaction gas containing oxygen plasma is supplied into a gas feed conduit connected to the reaction chamber. Microwaves are applied inside the gas feed conduit in order to produce sufficient oxygen radicals from the oxygen plasma, the oxygen radicals being necessary to initiate SACVD deposition. A stream of a second reaction gas is supplied into the reaction chamber, with the second reaction gas being suitable to initiate SACVD deposition when reacting with oxygen radicals. The first reaction gas in which sufficient oxygen radicals have been produced from oxygen plasma is supplied into the reaction chamber to perform an SACVD deposition within the reaction chamber through reaction of oxygen radicals with the second reaction gas.

Another embodiment of the present invention provides a deposition reactor for performing an SACVD deposition technique for fabricating a semiconductor integrated circuit. The reactor includes a reaction chamber, a heater for heating the chamber, at least one reaction gas feed conduit, and a magnetron device. The reaction gas feed conduit supplies a reaction gas to the interior of the chamber, and the magnetron device produces sufficient radicals of the reaction gas within the chamber to initiate a deposition reaction. In one preferred embodiment, the reactor also includes a gas feed pump for forcing the reaction gas into the chamber.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

In order to better understand the features of the present invention and the differences from the prior art, a process reactor for SACVD deposition according to the prior art will first be described hereinbelow with reference to FIG. 1. Then, preferred embodiments of the present invention will be described in detail hereinbelow with reference to FIG. 2.

In general, preferred embodiments of the present invention are directed to methods for fabricating monolithically integrated electronic circuits having at least one dielectric material layer. The following description covers deposition aspects of overlapping dielectric layers in detail for the convenience of illustration only.

Figure 1:
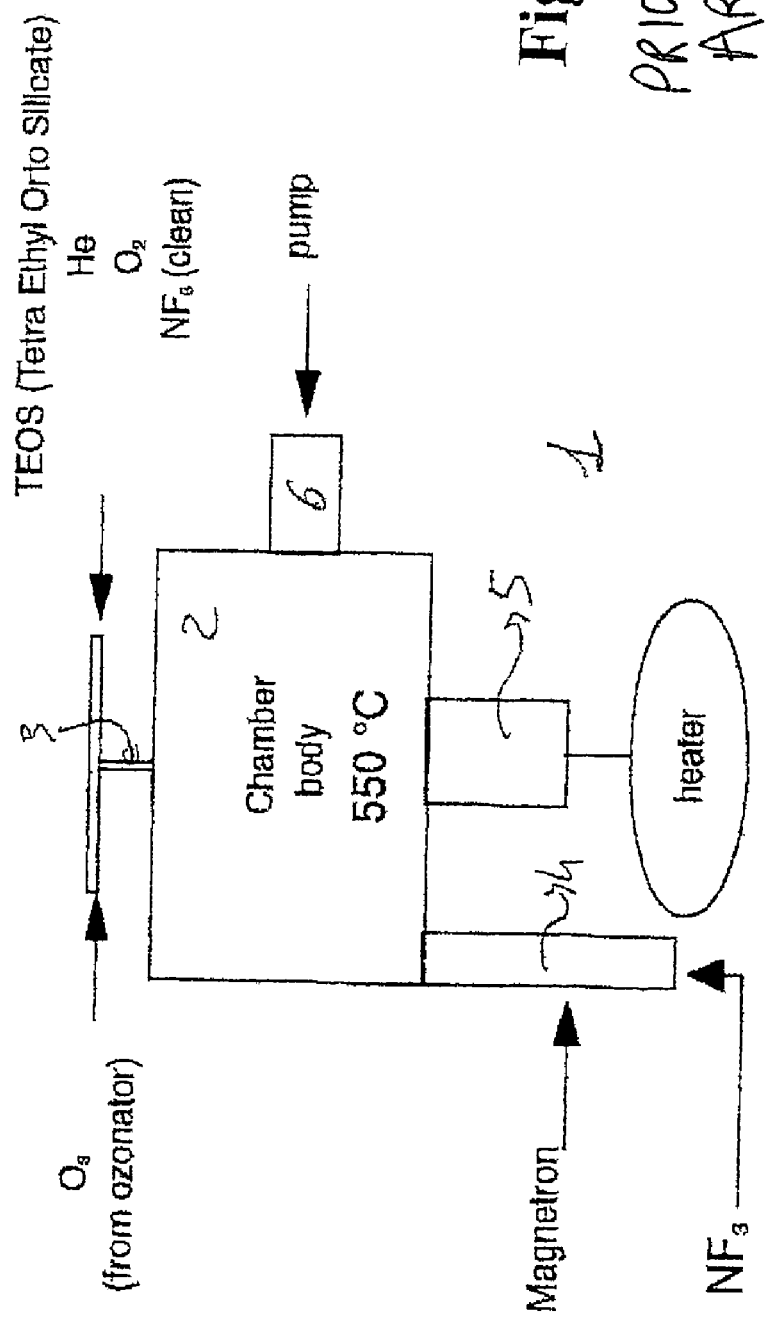
FIG. 1 shows a process reactor in which a conventional SACVD deposition process is carried out.
Figure 1:
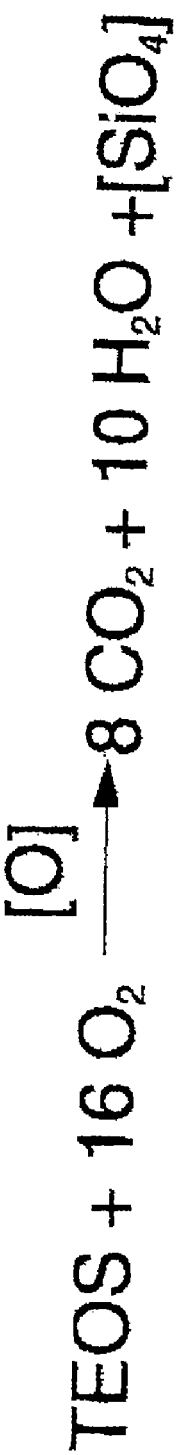

FIG. 1 shows a process reactor for fabricating electronic circuits integrated on a semiconductor in which SACVD deposition operations are carried out according to the prior art.

This reactor has a reaction chamber 2, which basically includes a quartz tube, that receives or is injected by components of the reaction which leads to the formation of deposited layers of dielectric material on the semiconductor.

The reaction chamber 2 is provided conventionally with an opening (not shown) for introducing the semiconductor wafers to be reacted, and for subsequently taking them out. A gas feed conduit 3 leads to the interior of the reaction chamber 2 for feeding the chamber interior with gas phase reactants. This feed conduit 3 branches off outside the chamber 2 to receive separate gas streams from respective sources (not shown). The reaction chamber 2 has a magnetron device 4 associated therewith which emits electromagnetic waves into the chamber for the purpose of scattering the gas molecules therein. In the conventional design of FIG. 1, the magnetron is only provided to dissociate the $NF_3$ gas for cleaning.

The reaction chamber 2 also includes a heater 5 for raising its internal temperature to a predetermined fixed value for the chemical reaction to take place. Furthermore, a pump 6 for adjusting the process pressure is associated with the reaction chamber 2.

Figure 2:
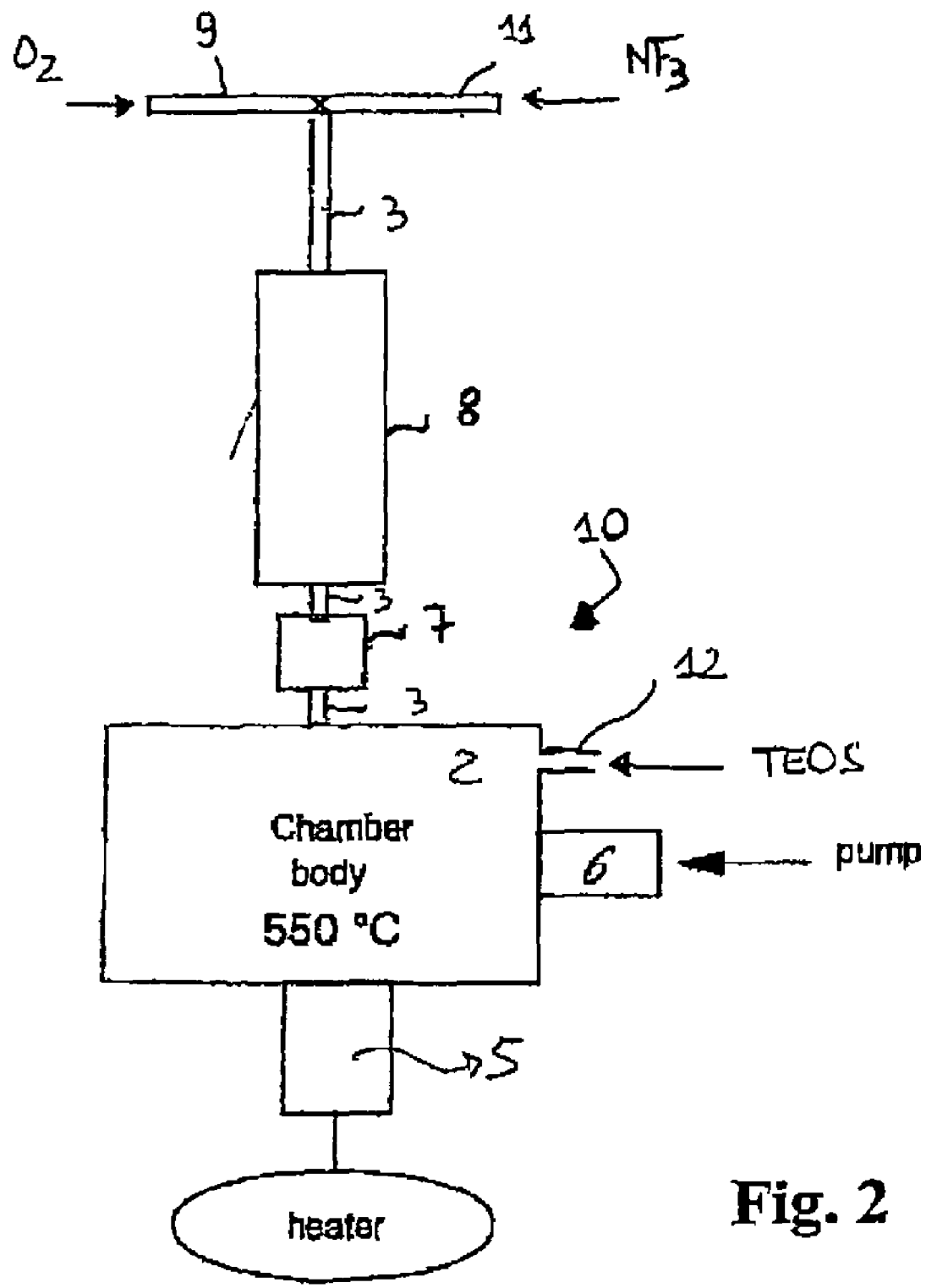
FIG. 2 shows a process reactor in which an SACVD deposition process is carried out in accordance with a preferred embodiment of the present invention.

FIG. 2 shows a process reactor for fabricating electronic circuits integrated on a semiconductor in which SACVD deposition operations are carried out in accordance with a preferred embodiment of the present invention. The elements of reactor 10 of FIG. 2 which are the same as or equivalent to corresponding elements of the reactor 1 of FIG. 1 have the same reference numerals.

In accordance with this preferred embodiment of the present invention, the reactor 10, as compared to the reactor 1 described above, includes an additional pump 7 on the process gas feed conduit 3. The additional pump 7 may be a rotor pump. Also, a magnetron 8 is mounted on the conduit 3 upstream of the pump 7 instead of being associated to the reaction chamber 2. Upstream of the magnetron 8, the conduit 3 ends with two branches, namely a conduit 9 for oxygen plasma supply and a conduit 11 for the reactant gas used for cleaning (e.g., nitrogen trifluoride $NF_3$ in this preferred embodiment).

In addition, the reactor 10 includes a separate conduit 12 for feeding the reactant gas (e.g., TEOS in this preferred embodiment) used for the SACVD deposition into the reactor chamber 2. Furthermore, an impedance adapter (matching network) is provided at the branches to suit the discharge of nitrogen trifluoride ($NF_3$) and oxygen ($O_2$).

A deposition method according to a preferred embodiment of the present invention will now be described in detail. During the SACVD process which by deposition leads to the formation of layers of dielectric material on semiconductor, a stream of remote oxygen ($O_2$) plasma coming from the conduit 9 is supplied to the feed conduit 3 and then fed to the magnetron 8. Separately, a stream of reactant gas (e.g., vapor TEOS in this preferred embodiment) is supplied into the reaction chamber 2 through the conduit 12.

The magnetron device is operated to scatter the oxygen molecules as much as possible, thereby enabling free oxygen (O) radicals to be released onto the substrate, without exposing it to the plasma action.

By adjusting the magnetron action, a proportion of oxygen (O) radicals can be produced in a wide range of concentrations (ideally 0 to 98%). This is especially important to an optimum gap filling of the dielectric material layer being formed, even at other than the standard TEOS flow rate. Further, this allows the throughput of the reactor 10 to be increased with no tradeoffs in the properties of this SACVD deposition technique.

The stream leaving the magnetron 8 which contains oxygen radicals necessary to initiate an SACVD deposition method is fed through the conduit 3 into the pump 7 and then forced into the reaction chamber 2 to initiate the SACVD deposition of $SiO_2$ film by reaction of oxygen radicals with vapor TEOS.

During the cleaning, a stream of nitrogen trifluoride ($NF_3$) coming from the conduit 11 is supplied to the feed conduit 3 and then fed to the magnetron 8. The $NF_3$ gas is then dissociated by means of the operation of the magnetron 8 and the resulting stream containing dissociated $NF_3$ gas is fed through the conduit 3 into the pump 7 and then forced into the reaction chamber 2 to initiate cleaning.

An essential feature of the method according to the preferred embodiment of the present invention is that ozone ($O_3$) is not used as a process gas.

In one practical embodiment, the pressure value at which the plasma discharge is activated in the magnetron is 1.5 Torr. The process pressure is near-ambient and approximately equal to 700 Torr. Consequently, forcing the gas stream, which contains the oxygen (O) radicals at a low pressure, into a high-pressure reactor could pose a problem. In the preferred embodiment, this problem is obviated by the provision of a pump 7 (e.g., a rotor pump) between the magnetron 8 and the chamber 2. In practical terms, such an additional pump is definitely less expensive than the ozonizer of the conventional apparatus. The rotor pump 7 may be calibrated for operating in the 1 to 100 Torr range. To prevent corrosion problems with the pump from the oxygen (O) radicals, the pump may be kept lubricated with suitable lubricants (e.g., a polyfluorinated oil such as Fomblin).

The method and the reactor of the present invention solve the technical problem of having as reactive gas the ozone in limited concentration, and offer a number of advantages. For example, they make possible an SACVD deposition with good gap-fill and step coverage, while providing a significantly higher throughput than current systems.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method of using SACVD deposition to deposit at least one layer of dielectric material inside a deposition reactor during the fabrication of at least one semiconductor integrated circuit, said method comprising the steps of:
   providing a reaction chamber for carrying out SACVD deposition;
   supplying a stream of a first reaction gas containing oxygen plasma into a first gas feed conduit connected to the reaction chamber;
   applying microwaves inside the first gas feed conduit in order to produce sufficient oxygen radicals from the oxygen plasma, the oxygen radicals being necessary to initiate SACVD deposition;
   supplying a stream of a second reaction gas into the reaction chamber through a second gas feed conduit, the second reaction gas being suitable to initiate SACVD deposition when reacting with oxygen radicals; and
   supplying the first reaction gas, in which sufficient oxygen radicals have been produced from oxygen plasma, from the first gas feed conduit into the reaction chamber to perform an SACVD deposition within the reaction chamber through reaction of oxygen radicals with the second reaction gas.

2. The method as defined in claim 1,
   wherein in the step of supplying the stream of the first reaction gas, the first reaction gas is oxygen, and
   in the step of applying microwaves, an oxygen plasma containing oxygen radicals is produced.

3. The method as defined in claim 1, wherein the microwave activation pressure is 1.5 Torr.

4. The method as defined in claim 1, wherein in the step of supplying the first reaction gas from the first gas feed conduit into the reaction chamber, a remote plasma of the first reaction gas is forced into the reaction chamber.

5. The method as defined in claim 1, wherein the reaction pressure is within the range of 1 to 700 Torr.

6. The method as defined in claim 1, wherein ozone is not supplied as a process gas in performing the SACVD deposition within the reaction chamber.

7. The method as defined in claim 2, wherein ozone is not supplied as a process gas in performing the SACVD deposition within the reaction chamber.

8. A method of using SACVD deposition to deposit at least one layer of dielectric material inside a deposition reactor during the fabrication of at least one semiconductor integrated circuit, said method comprising the steps of:
   supplying an oxygen plasma into a gas feed conduit connected to a reaction chamber;
   applying microwaves to the oxygen plasma in the gas feed conduit in order to produce sufficient free oxygen radicals from the oxygen plasma to initiate SACVD deposition; and
   supplying the free oxygen radicals, which have been produced in the gas feed conduit, from the gas feed conduit into the reaction chamber of the reactor to perform SACVD deposition within the reaction chamber through reaction of the oxygen radicals.

9. The method as defined in claim 8, wherein the microwave activation pressure is 1.5 Torr.

10. The method as defined in claim 8, wherein in the step of supplying the free oxygen radicals, the free oxygen radicals are forced into the reaction chamber.

11. The method as defined in claim 8, wherein ozone is not supplied as a process gas in performing the SACVD deposition within the reaction chamber.

12. The method as defined in claim 8, wherein the step of applying microwaves includes the sub-steps of:
   receiving, from a first portion of the gas feed conduit, the oxygen plasma that is supplied at a magnetron;
   operating the magnetron to produce the microwaves that are applied to the oxygen plasma; and
   discharging a stream of the oxygen plasma from the magnetron to a second portion of the gas feed conduit that is connected to the reaction chamber.

13. A method of using SACVD deposition to deposit at least one layer of dielectric material inside a deposition reactor during the fabrication of at least one semiconductor integrated circuit, said method comprising the steps of:
- providing a reaction chamber for carrying out SACVD deposition;
- supplying a stream of oxygen to a magnetron;
- operating the magnetron to produce microwaves so as to generate within the magnetron an oxygen plasma containing sufficient free oxygen radicals to initiate SACVD deposition;
- discharging a stream of the oxygen plasma from the magnetron; and
- supplying the stream of the oxygen plasma from the magnetron into the reaction chamber to perform SACVD deposition within the reaction chamber through reaction of the oxygen radicals.

14. The method as defined in claim 13, wherein the microwave activation pressure is 1.5 Torr.

15. The method as defined in claim 13, wherein in the step of supplying the stream of the oxygen plasma into the reaction chamber, the stream of the oxygen plasma is forced into the reaction chamber.

16. The method as defined in claim 13, wherein ozone is not supplied as a process gas in performing the SACVD deposition within the reaction chamber.

* * * * *